(12) United States Patent
Suter

(10) Patent No.: US 6,408,254 B1
(45) Date of Patent: Jun. 18, 2002

(54) PROCEDURE AND DEVICE FOR CALIBRATING THE GAS PRESSURE IN A PROCESS VACUUM CHAMBER (RECEIVER)

(75) Inventor: Rudolf Suter, Horw (CH)

(73) Assignee: Satis Vacuum Industries Vertriebs-AG, Baar (CH)

( * ) Notice: Subject to any disclaimer, the term of this patent is extended or adjusted under 35 U.S.C. 154(b) by 0 days.

(21) Appl. No.: 09/353,450

(22) Filed: Jul. 14, 1999

(30) Foreign Application Priority Data

Jul. 14, 1998 (CH) ............................................. 1507/98

(51) Int. Cl.$^7$ ................................................. G06D 1/02
(52) U.S. Cl. ............................. 702/98; 702/85; 702/99; 702/138
(58) Field of Search ........................ 356/43; 73/19.12, 73/4, 1, 753, 19; 250/343, 306; 324/462; 702/98, 99, 138, 85

(56) References Cited

U.S. PATENT DOCUMENTS

| | | | |
|---|---|---|---|
| 4,270,091 A | * | 5/1981 | Mann ........................... 324/462 |
| 4,366,700 A | * | 1/1983 | Bouck ........................... 73/19 |
| 4,493,553 A | * | 1/1985 | Korb et al. .................... 356/43 |
| 4,833,921 A | * | 5/1989 | Longo et al. .................. 73/753 |
| 4,854,153 A | * | 8/1989 | Miyagawa et al. ............... 73/1 |
| 4,988,871 A | * | 1/1991 | Gogol .......................... 250/306 |
| 5,369,278 A | * | 11/1994 | Lehto .......................... 250/343 |
| 5,515,711 A | * | 5/1996 | Hinkle ........................... 73/4 |
| 6,003,362 A | * | 12/1999 | Dieckmann et al. ........... 73/19.12 |

FOREIGN PATENT DOCUMENTS

| | | | | |
|---|---|---|---|---|
| JP | 56009369 | 1/1981 | ........... | C23C/15/00 |
| JP | 04160357 | 6/1992 | ........... | G01N/27/62 |

* cited by examiner

Primary Examiner—Marc S. Hoff
Assistant Examiner—Felix Suarez
(74) Attorney, Agent, or Firm—Venable; Gabor J. Kelemen; Catherine M. Voorhees

(57) ABSTRACT

A system for treating goods, in particular for coating optical substrates, under a vacuum, within a gas-tight sealable, evacuatable vacuum chamber (receiver) that can be provided with an inert gas atmosphere, includes a device for calibrating the gas pressure in the receiver for a respective operating cycle. The calibrating device has a calibration pressure vessel (2) having a volume (v) lower than the volume (V) of the receiver (1) and is connected in terms of flow with an inert gas source and the receiver (1) via actuatable valve fittings (3, 4), wherein the receiver (1) and calibration pressure vessel (2) are each linked via a pressure gage (5 or 6) with a computer (7), which controls the valve fittings (3, 4) for introducing the gas into the calibration pressure vessel (2) or receiver (1) by way of a downstream controller (8). The measures of the calibration device make it possible to calibrate the gas pressures in a gas-tight sealable, evacuatable vacuum chamber (receiver) that can be provided with an inert gas atmosphere, in such a way as to repeatedly ensure a preset, constant gas concentration in the receiver within an operating or treatment cycle.

4 Claims, 1 Drawing Sheet

PROCEDURE AND DEVICE FOR CALIBRATING THE GAS PRESSURE IN A PROCESS VACUUM CHAMBER (RECEIVER)

This invention relates to a procedure for calibrating the gas pressure in a gas-tight sealable, evacuatable process vacuum chamber (receiver) that can be provided with an inert gas atmosphere.

BACKGROUND OF THE INVENTION

In arrangements for treating goods, in particular for coating optical substrates, under a vacuum, which encompass a gas-tight sealable, evacuatable vacuum chamber (receiver) that can be provided with an inert gas atmosphere, the gas concentration in the receiver within an operating or treatment cycle becomes significantly important to achieve the highest possible quality for the resultant coating.

Previous measures to meter the inert gas, e.g., nitrogen N2 or Argon Ar, into the receiver e.g., by means of an ionization manometer-controlled gas metering valve for high-vacuum systems are not able to satisfy the current demands on a preset, constant gas concentration in the receiver within an operating or treatment cycle to achieve the highest possible quality for the resultant coating.

SUMMARY OF THE INVENTION

Therefore, the object of this invention is to provide a procedure for calibrating the gas pressure in a gas-tight sealable, evacuatable vacuum chamber (receiver) that can be provided with an atmosphere, which is able to repeatedly ensure a preset, constant gas concentration in the receiver within an operating or treatment cycle.

The object is achieved according to the invention for an operating cycle by:

a) degassing the receiver and measuring the residual gas to be relayed to a computer as a residual gas signal, b) using the computer to determine a calibration factor from the residual gas signal and a working pressure for the gas in the receiver preset for the computer, whereupon an output signal proportional to the calibration factor is employed to introduce an amount of gas with the corresponding pressure into a calibration pressure vessel with a volume lower than the volume of the receiver, and c) transferring the gas under isothermal conditions from the calibration pressure vessel to the receiver in which the preset working pressure of the gas comes about.

In this case, the working pressure of the gas in the receiver can be measured and relayed to the computer as an actual signal for correcting the calibration factor.

For executing the procedure, this invention also relates to a system for treating goods, in particular for coating optical substrates, under a vacuum, with a gas-tight sealable, evacuatable process vacuum chamber (receiver) that can be provided with an inert gas atmosphere.

According to the invention, this system is characterized by a device for calibrating the gas pressure in the receiver for a respective operating cycle, with a calibration pressure vessel having a volume lower than the volume of the receiver, whose calibration pressure vessel is connected in terms of flow with an inert gas source and the receiver via actuatable valve fittings, wherein the receiver and calibration pressure vessel are each linked via a pressure gauge with a computer, which controls the valve fittings for introducing the gas into the calibration pressure vessel or receiver by way of a downstream controller.

BRIEF DESCRIPTION OF THE DRAWINGS

A basic schematic of the system for executing this procedure illustrates in greater detail a possible form of execution for the procedure according to the invention.

DETAILED DESCRIPTION OF THE INVENTION

Figure 1:
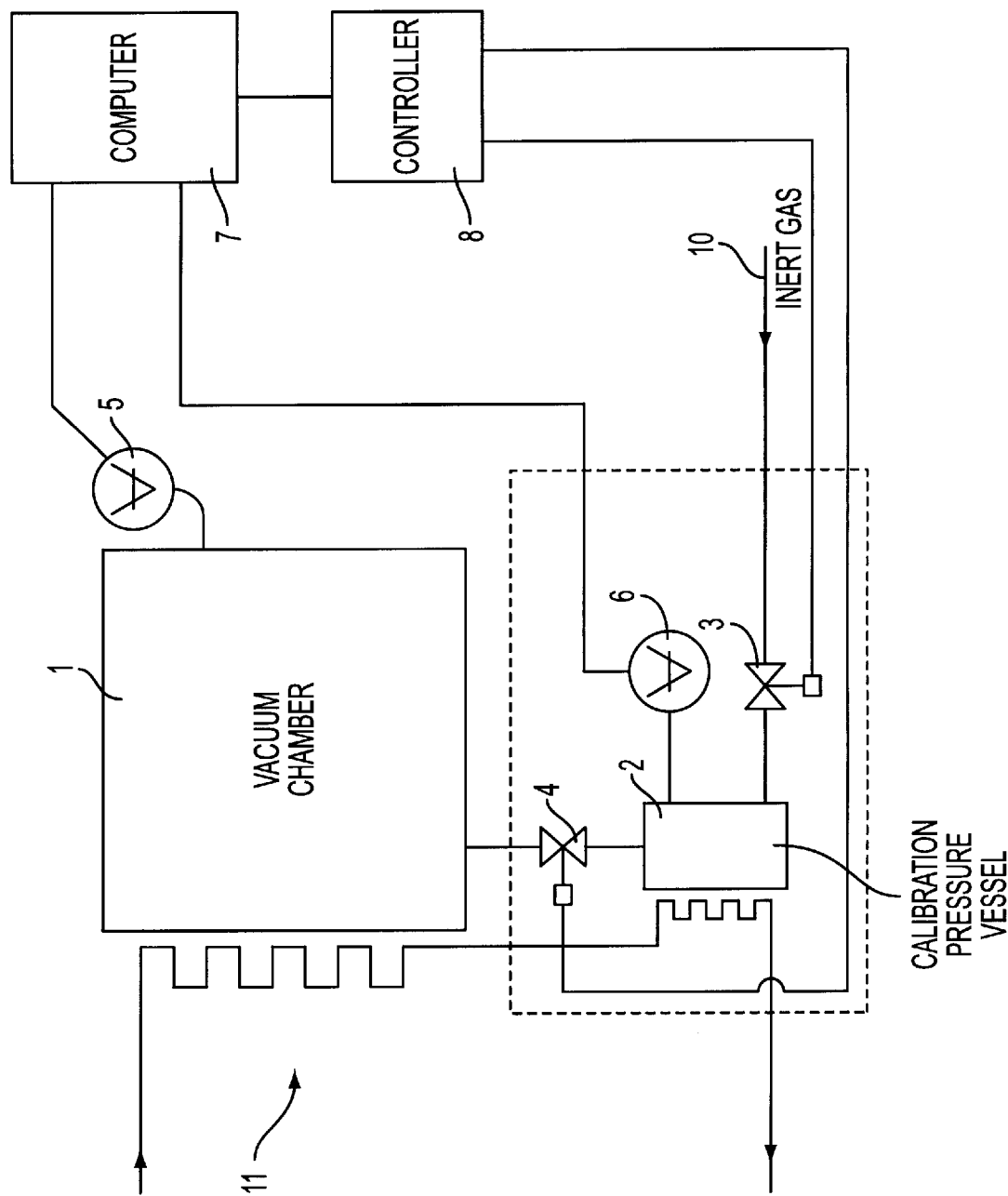

The schematically depicted system for treating goods, in particular for coating optical substrates, under a vacuum, encompasses a gas-tight sealable, evacuatable process vacuum chamber 1 (receiver) that can be provided with an inert gas atmosphere.

This receiver 1 is preceded by a device for calibrating the gas pressure in the receiver for a respective operating cycle, with the device encompassing a calibration pressure vessel 2 having a volume v lower than the volume V of the receiver 1, whose calibration pressure vessel 2 is connected in terms of flow with an inert gas source 10 and the receiver 1 via actuatable valve fittings 3, 4.

The receiver 1 and calibration pressure vessel 2 are additionally each linked via a pressure gauge 5 or 6 with a computer 7, which controls the valve fittings 3, 4 for introducing the gas into the calibration pressure vessel 2 or receiver 1 by way of a downstream controller 8.

To calibrate the gas pressure in the gas-tight sealable, evacuatable receiver 1 that can be provided with an inert gas atmosphere, the receiver 1 is degassed for an operating cycle, and the residual gas is measured with the pressure gauge 5, to then be relayed from there to the computer 7 as a residual gas signal.

The computer 7 then determines a calibration factor from the residual gas signal and a working pressure for the gas in the receiver 1 preset for the computer, whereupon an output signal proportional to the calibration factor is employed to introduce an amount of gas with the corresponding pressure (Pv) into the calibration pressure vessel 2 via the controller 8 and valve 3.

The valve 4 is then actuated, and the gas is transferred under isothermal conditions from the calibration pressure vessel 2 to the receiver 1, in which the preset working pressure of the gas (P(V+v)) comes about.

To achieve the isothermal conditions, the calibration pressure vessel 2 and receiver 1 are here brought to and kept at an identical temperature by means of a hot water heating system 11.

What is claimed is:

1. A process for calibrating gas pressure in a gas-tight sealable, evacuatable vacuum chamber provided with an inert gas atmosphere, an operating cycle of said process including the steps of:

a) degassing the inert gas atmosphere of the vacuum chamber, measuring the residual gas degassed from the vacuum chamber, and relaying the measured residual gas to a computer as a residual gas signal;

b) determining, at the computer, a calibration factor from the residual gas signal and a preset working pressure from the gas in the vacuum chamber, introducing a volume of inert gas with the preset working pressure into a calibration pressure vessel where the introduced gas volume is lower than the volume of the vacuum chamber; and c) transferring the introduced gas under isothermal conditions from the calibration pressure vessel to the vacuum chamber so that the preset working pressure remains substantially constant.

2. The process according to claim 1, further comprising the steps of measuring the working pressure of the gas within the vacuum chamber and relaying the measured gas pressure within the vacuum chamber in order to correct the calibration factor.

3. In a system for treating goods under a vacuum in a gas-tight sealable evacuatable vacuum chamber that can be provided with an inert gas atmosphere, a device for calibrating the gas pressure in the vacuum chamber for a respective operating cycle, said calibrating device comprising:

a calibration pressure vessel having a volume of inert gas lower than the volume of gas in the vacuum chamber, said calibration pressure vessel being connected at one end to the vacuum chamber via an actuatable valve fitting; and an inert gas source connected to an end opposite the one end of the calibration pressure vessel via a second actuatable valve fitting wherein the vacuum chamber and calibration pressure vessel are each linked via a pressure gage to a computer, which controls the valve fittings for introducing inert gas into the calibrating pressure vessel in a vacuum chamber by way of a downstream controller.

4. The calibrating device according to claim 3, wherein the system for treating goods coats optical substrates under a vacuum.

* * * * *